United States Patent

Daniels et al.

[15] 3,688,163

[45] Aug. 29, 1972

[54] COLD WELDED SEMICONDUCTOR PACKAGE HAVING INTEGRAL COLD WELDING OIL

[72] Inventors: Dale L. Daniels, Kokomo; Thomas J. Furnival, Logansport, both of Ind.

[73] Assignee: General Motors Corporation, Detroit, Mich.

[22] Filed: Aug. 4, 1970

[21] Appl. No.: 60,865

[52] U.S. Cl. .......317/234 R, 317/234 A, 317/234 G, 317/234 P, 29/470.1, 29/473.1, 174/52

[51] Int. Cl. ...............................H011 3/00, H011 5/00

[58] Field of Search...317/234, 235 A, 235 D, 235 F, 317/235 G, 235 H, 235 J, 235 P, 235 W; 29/470, 470.1, 471.9, 472.9, 473.1, 473.3; 174/50.5, 52

[56] References Cited

UNITED STATES PATENTS

| | | | |
|---|---|---|---|
| 2,897,419 | 7/1959 | Howland et al. | 29/470 |
| 3,532,942 | 10/1970 | Boyer | 317/234 |
| 3,581,160 | 5/1971 | Piccone | 317/234 |
| 3,179,860 | 4/1965 | Clark et al. | 317/234 |
| 3,182,845 | 5/1965 | Culbertson et al. | 29/470.1 X |
| 3,190,952 | 6/1965 | Bitko | 317/234 X |
| 3,226,820 | 1/1966 | Anthony et al. | 317/234 X |
| 3,394,451 | 7/1968 | Stuart | 29/473.1 |
| 3,452,254 | 6/1969 | Boyeri | 317/234 |
| 3,489,957 | 1/1970 | DeWarga | 317/234 |
| 3,534,233 | 10/1970 | Long | 317/234 |

OTHER PUBLICATIONS

Thyristors and Rectifiers Diodes; Spectum IEEE Aug. 1967 page 109

*Primary Examiner*—John W. Huckert
*Assistant Examiner*—Andrew J. James
*Attorney*—William S. Pettigrew and R. J. Wallace

[57] ABSTRACT

A hermetically sealed enclosure for a semiconductor device and method for making same which includes providing a tubular ceramic housing with a circumferential integral cold welding die on one end face thereof. A cold weldable layer is bonded to the one end face of the housing, with a portion of the layer overlying the die. A first cover member is cold welded to the layer over the die to provide a hermetic seal at the die end and a first electrical and thermal contact. A second cover member hermetically encloses the end opposite the integral die and provides an electrical and thermal contact at the opposite end of the housing.

3 Claims, 4 Drawing Figures

PATENTED AUG 29 1972 3,688,163

INVENTORS
Dale L. Daniels &
BY Thomas J. Furnival

R. J. Wallace
ATTORNEY

COLD WELDED SEMICONDUCTOR PACKAGE HAVING INTEGRAL COLD WELDING OIL

This invention relates to a semiconductor device and more particularly to an enclosure for a high voltage semiconductor device and a method of fabricating such an enclosure.

In order to provide a suitable commercial enclosure for a high voltage, high current semiconductor device, on the order of 1400 volts and 500 amperes, numerous factors, often opposing, must be considered. For example, a high resistance path must generally be provided between contacts of opposite polarity in order to prevent arcing or electrical breakdown therebetween. Accordingly, the device is often housed or enclosed by insulator-type material, such as a refractory or ceramic housing, which is ordinarily a poor thermal conductor. On the other hand, the heat generated by such a high current device dictates that the device be in intimate contact with a large surface area of metal of good thermal conductivity, which is ordinarily a poor insulator.

Further, it is often required that the enclosure be hermetically sealed since it is sometimes used in a contaminating environment, the exposure to which could affect the device performance. A common technique of bonding metal to ceramic-type material is by brazing. Brazing, as herein used, refers to a method of securing two contacting surfaces together by fusing a metal therebetween at an elevated temperature. Commercially, brazing of metal onto ceramic-type material is generally done in a furnace. However, a semiconductor within the ceramic housing can be adversely affected by this method of brazing. On the other hand, if one attempts to hermetically seal such a housing by hot welding a cover member to a previously brazed surface thereon, the flash produced thereby can also deleteriously affect the enclosed semiconductor device.

It would be highly desirable if one could use a commercially proven high volume assembly technique such as cold welding to enclose such a semiconductor device. The use of cold welding would avoid exposing the semiconductor device both to hot welding flash and the high temperatures of a brazing operation. However, previous attempts to provide a suitable ceramic-like enclosure, hermetically sealed by cold welding, have often been commercially unsuccessful. For example, one type of package heretofore provided has flanges which are cold welded together beyond the outside diameter of the housing. Not only does this type of package require more space, but it was found that the projecting flanges can be easily damaged and the hermetic seal broken. Furthermore, such projections provide a lower resistance path between contacts of opposite polarity and, accordingly, are not suitable for some high voltage enclosures. Moreover, die wear, especially in making large diameter cold welds, can be high necessitating frequency refinishing of the die surface or even die replacement. Such frequent die repairs can negate any economic advantage otherwise obtained by utilizing cold welding techniques.

It is an object of this invention to provide a method of hermetically sealing a ceramic-like housing for a semiconductor device wherein the cold weld is made inward of the outside diameter of the housing.

Another object of this invention is to provide a commercially practical enclosure which has been hermetically sealed by cold welding yet is suitable for high voltage devices.

Another object of this invention is to provide a method of hermetically sealing a ceramic-like housing by cold welding a cover member thereto, wherein expensive die repairs are avoided.

In accordance with one aspect of this invention, a method of hermetically enclosing a semiconductor device includes providing a tubular ceramic housing with a circumferential integral cold welding die on one end face thereof; brazing a cold weldable layer, a portion of which overlies the die, over the one end face; and cold welding the rim of a cover member to the cold weldable layer on the die of the one end face providing a hermetic seal thereat and an electrical and thermal contact for a semiconductor device within the housing.

Other objects, features and advantages of this invention will become more apparent from the following description of the preferred example and from the drawings in which.

Figure 1:
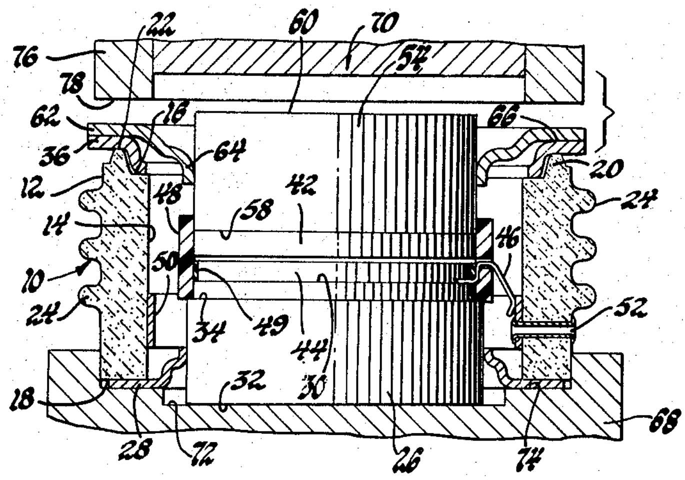
FIG. 1 shows a sectional view of an enclosure and a pressing assembly used to carry out the invention.
Figure 2:
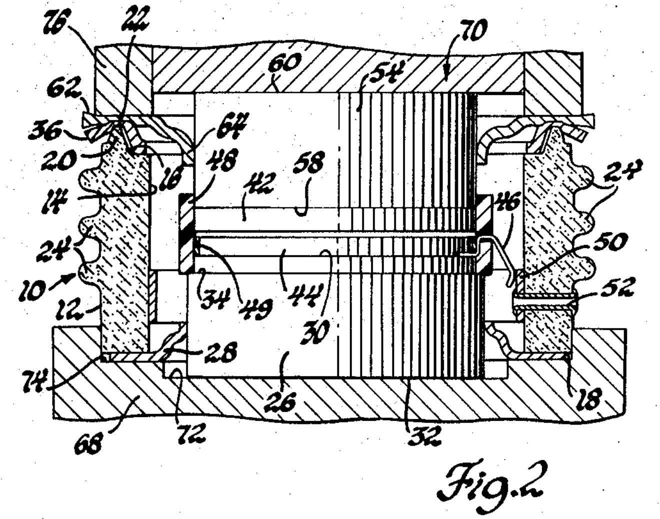
FIG. 2 depicts the assembly in pressing engagement with the enclosure.

Referring now to the figures, FIGS. 1 and 2 in particular, show a generally tubular ceramic housing 10 which is of aluminum oxide, or the like. Housing 10 has an outer surface 12, a longitudinal bore 14 therethrough, and front and back annular end faces designated 16 and 18, respectively. The bore has a diameter of 1.36 inches and a length of 630 mils between the end faces. The width of each end face is 120 mils. An integral continuous cold welding projection 20, in the form of an annulus, extends perpendicularly from the front face 62 mils and provides a flat land 22 having a radial width of 50 mils. Projection 20 is nonperimetric being spaced 30 mils from bore 14, the inner edge of face 16.

The outer surface of housing 10 has three spaced apart arcuate convolutions, designated by numeral 24, which extend radially outwardly from the outer surface between the front and back faces. The use of such convolutions is an accepted and well known method of increasing the creep distance between high voltage contacts.

A copper back cover member which includes a thick cylindrical contact 26 circumscribed by a thin stepped rim 28 encloses the back end of bore 14. Contact 26 has a flat end surface 30 located within the central interior portion of bore 14 and an opposing end surface 32 located exteriorly of the housing. Surface 30, which provides a pedestal for semiconductor devices inserted within the bore of the housing, is surrounded by an integral shoulder 34. Rim 28 is 28 mils thick and includes an outermost step portion and an innermost riser portion. The outermost step portion of rim 28 overlies an inner portion of back end 18 being brazed thereto by conventional techniques which provides a hermetic seal therearound. The innermost riser portion of rim 28 is brazed completely around the longitudinal side of contact 26 and extends within bore 14.

A cold weldable stepped copper ring, which has an outermost step portion 36 and an innermost step portion 38 spaced apart by riser portion 40, covers front face 16 including land 22. The step portions of the ring, or layer, extend parallel to each other and to land 22. The ring extends from adjacent bore 14 to a position adjacent the outer periphery of the front face. The ring is 28 mils thick. Step portion 38 is brazed completely around front face 16 radially intermediate the projection 20 and bore 14, providing a hermetic seal thereat. Step portion 36 rests freely on land 22 and provides a flat continuous cold weldable front surface.

A disc-like semiconductor device is within bore 14 on end surface 30. The semiconductor element as herein described is a conventional silicon controlled rectifier device with anode, cathode and gate electrodes, labelled 42, 44 and 46 respectively, attached thereto. The cathode electrode, which is in the form of a metal slug, is bonded to the back face of the element and covers end surface 30 forming an interface therewith providing a back thermal and electrical contact for the enclosure.

The anode electrode, also in the form of a metal slug, is bonded to the front face of the element and provides a flat front surface. A plastic insulator 48 rests on shoulder 34 within the housing surrounding the semiconductor device, while a rubber insulator 49 generally surrounds the cathode electrode. Gate electrode 46 is a resilient finger-like metallic member which extends outward from the semiconductor device through openings in insulators 48 and 49 and engages a platinum ring 50 conventionally bonded to the surface of bore 14 within the housing. A tubular metallic member 52 extends through the side of the housing and contacts ring 50 providing an electrical contact for the gate.

Returning now to the enclosure, a copper front cover member, which includes a thick cylindrical contact 54 circumscribed by a thin stepped rim, encloses the front end of bore 14. Contact 54 has a flat end surface 58 located within the central interior portion of the housing and an opposed end surface 60 located exteriorly of the housing. Surface 58 contacts the flat surface of the anode electrode providing a front thermal and electrical contact for the enclosure. Both contact 26 and 54 have a diameter not substantially smaller than the inside diameter of the housing thereby providing an efficient electrical and thermal contact.

The rim of the front cover member, which is 28 mils thick, includes an outermost step portion 62 and an innermost riser portion 64. Step portion 62 provides a flat back surface which completely overlies the front surface of step portion 36 of the ring forming a continuous cold weldable interface 66. Riser portion 62 is rigidly secured to contact 54 by conventional brazing techniques and extends within bore 14.

A method of hermetically sealing the housing can now be described. With particular reference to FIG. 2, it shows a cold welding assembly including a stationary back-up or support bed 68 and a movable anvil 70. Bed 68 has a recess 72 with a peripheral shoulder 74 for receiving the outermost step portion of the back cover member. The movable anvil 70 has a depending annular portion 76 which terminates in a flat surface 78. Surface 78 completely overlies land 22 of the housing when the back side of the enclosure is seated within recess 72 of the support tool.

To effect a cold weld generally about interface 66, surface 78 of projection 76 is brought into pressing engagement with that segment of outermost step portion 62 over the integral cold welding projection. Accordingly, the metal generally overlying land 22 is compressed and a continuous cold weld is formed generally over the land. It should be pointed out that projection 20 functions as an integral cold welding die during the aforesaid cold welding operation. Therefore, only the flat surface of the anvil is repeatedly used, which surface configuration is not as likely to wear as would a die surface. Therefore, periodic replacement is avoided.

It should be further mentioned that the flat surface 78 of the depending annular portion should overlie at least one half of the land area around projection 20 in order to obtain an acceptable continuous cold weld. The likelihood of obtaining an imperfect hermetic seal can be greatly increased if less than one half of the land area is involved in the cold welding operation. Preferably, the width of surface 78, for longer usefulness, should be at least twice the width of the land. Also, the land and surface 78 should be parallel for best results.

Figure 3:
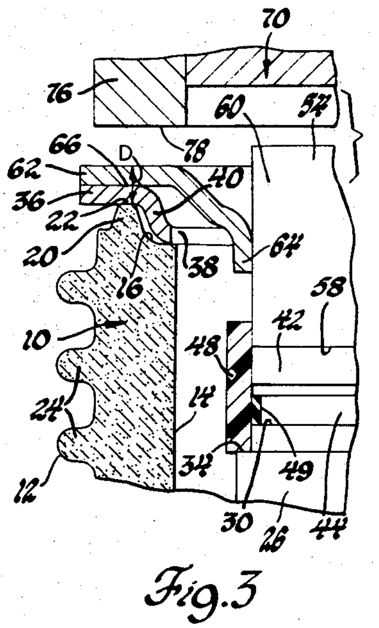
FIG. 3 shows an enlarged detail view of a portion of FIG. 1.
Figure 4:
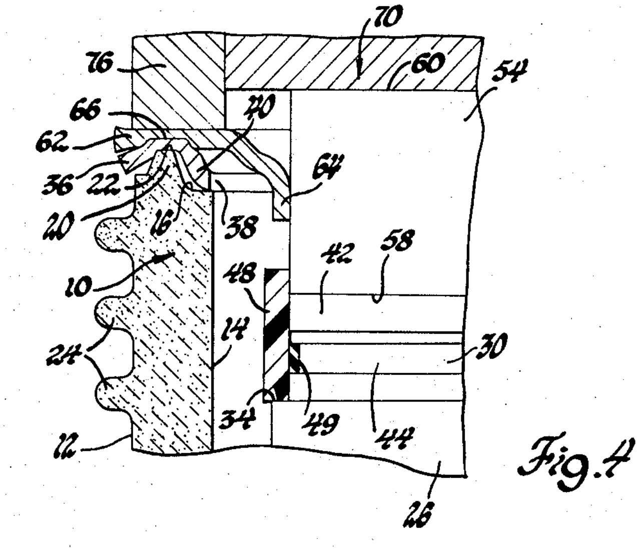
FIG. 4 shows an enlarged detail view of a portion of FIG. 2.

An acceptable cold weld is obtained if the combined thickness of step portion 62 and step portion 36 overlying land 22, designated by D in FIG. 3, be reduced to about 65 percent of its original thickness. However, acceptable cold welds can be obtained if thickness D be reduced to about 50 – 80 percent of its original thickness. A reduction of more than about 80 percent can greatly weaken the weld, making it susceptible to fracture. A reduction of less than about 50 percent of the original thickness greatly decreases the likelihood of obtaining a continuous hermetic seal.

Moreover, for cold welds, as is well known, the thickness of each cold welded member, those forming interface 66, should preferably be about 0.44 – 0.56 times the radial width of the land. However, a thickness to width ratio of about 0.25 – 0.75 can be acceptable. If the cold-weldable members are too thick, excessive pressure is required which, if not uniformly distributed, could damage the ceramic housing. On the other hand, if the members are too thin, punctures can readily occur during the cold welding operation.

To continue, while the respective rims of the front and back cover members are described as stepped other configurations may be used. For example, a U-type shape could be used. However, it has been found that a stepped rim can effectively provide stress relief during the aforesaid cold welding operation. More specifically, the rims provide flexible expansion areas which can move inwardly during the formation of the weld thereby preventing rim breaks which could occur.

It should also be noted that although the herein-described embodiment has included specific dimensions and has been described with reference to a specific semiconductor device, no such limitation is intended. For example, any suitable semiconductor device, including integrated circuits, can be so enclosed. Moreover, other resistive materials having a high resistivity similar to ceramic, such as glass, or the like, can be used. However, ceramic is preferred. Further, other cold weldable materials such as aluminum and alloys of copper and aluminum can be used for the cover members and ring. However, copper and particularly commercial oxygen-free high-conductivity copper is preferred.

It should be further noted that, although the integral cold welding die of this invention has been described as a projection, such a limitation is not intended. For example, one entire end face could constitute the integral die. Moreover, it should be understood that although the integral die configuration has been described herein as an annulus, any continuous circumferential configuration can be acceptable.

It should even further be noted that this invention minimizes the likelihood of localized portions of the enclosure becoming thermally isolated. For example, the surface area of the cold welded members is generally within the area of the ceramic housing. Moreover, a lower resistance path, through the ambient, is not provided as each cover member is inward of the extremities of the convolutions.

It is evident that many modifications and variations are possible within the scope of the invention.

What is claimed is as follows:

1. A hermetically sealed enclosure for a semiconductor device which comprises a tubular ceramic housing having first and second opposite end faces, a first cover member overlying a first end face of said housing and brazed thereto, said first cover member hermetically sealing said first end of the housing and providing a first electrical and thermal contact for the device, a continuous circumferential integral cold welding die on the second end face of said housing, a cold weldable layer brazed to said second end face, a portion of said layer continuously overlying the cold welding die, a second cover member on said second end of said housing providing a second electrical and thermal contact for the device, said second cover member having a radially extending rim, said rim cold welded to said layer portion throughout its circumference over said cold welding die and hermetically sealing said housing.

2. A hermetically sealed enclosure for a high voltage, high current semiconductor device which comprises a tubular ceramic housing having first and second opposite end faces, a first copper cover member brazed to the first end face, said cover member hermetically sealing said first end of said housing and providing a first electrical and thermal contact for said housing, a circumferential nonperimetric integral projection on the second end face of said housing, said projection providing a continuous integral cold welding die on the second end of said housing, a stepped copper ring, having outer and inner portions, overlying said second end face of said housing, said inner ring portion being brazed to said second end face inward of said projection and providing a hermetic seal therearound, said outer ring portion continuously overlying said housing projection, a second copper cover member on said second end providing a second electrical and thermal contact for said housing, a rim on said second cover member overlying said outer ring portion, said rim continuously cold welded thereto throughout its circumference over said projection and hermetically sealing said housing.

3. A hermetically sealed enclosure for a high voltage, high current silicon controlled rectifier which comprises a tubular ceramic housing having opposite first and second end faces, a plurality of concentric axially spaced annular projections radially extending from the outer surface of said housing between said end faces for increasing creep distance therebetween, a generally cylindrical cathode contact extending within said housing from the first end thereof and engaging the cathode electrode of a rectifier wafer in the housing, the diameter of said cathode contact being substantially equal to the inside diameter of said housing, a rim on said cathode contact overlying said first end face, said rim brazed to said second end face and hermetically sealing the first end of said housing, a circumferential nonperimetric integral projection of predetermined width on said second end face of said housing, said projection providing a continuous integral cold welding die on the second end of the housing, a stepped copper ring, having outer and inner portions, overlying said second end face of said housing, said inner ring portion being brazed completely around said second face inward of said projection, said outer ring portion continuously overlying at least one half the width of said projection, a generally cylindrical anode contact extending into said housing from said second end thereof and engaging the anode electrode of said rectifier wafer, the diameter of said anode contact being only slightly less than the inside diameter of said housing, an annular rim on said anode contact overlying said outer ring portion, said anode rim continuously cold welded thereto throughout its circumference over said projection and hermetically sealing the second end of said housing, and means for contacting the gate electrode of the rectifier wafer through said tubular housing.

* * * * *

PO-1050
(5/69)

UNITED STATES PATENT OFFICE
CERTIFICATE OF CORRECTION

Patent No. 3,688,163 Dated August 29, 1972

Inventor(s) Dale L. Daniels and Thomas J. Furnival

It is certified that error appears in the above-identified patent and that said Letters Patent are hereby corrected as shown below:

The title before the list of inventors should read:
-- COLD WELDED SEMICONDUCTOR PACKAGE HAVING INTEGRAL COLD WELDING DIE --.

Column 1, the title should read -- COLD WELDED SEMICONDUCTOR PACKAGE HAVING INTEGRAL COLD WELDING DIE --.

Signed and sealed this 23rd day of January 1973.

(SEAL)
Attest:

EDWARD M.FLETCHER,JR.
Attesting Officer

ROBERT GOTTSCHALK
Commissioner of Patents